United States Patent [19]

Osawa et al.

[11] Patent Number: 4,912,560
[45] Date of Patent: Mar. 27, 1990

[54] SOLID STATE IMAGE SENSING DEVICE

[75] Inventors: Shinji Osawa, Inagi; Yoshiyuki Matsunaga, Kamakura; Nozomu Harada, Yokohama, all of Japan

[73] Assignee: Kabushiki Kaisha Toshiba, Kawasaki, Japan

[21] Appl. No.: 302,248

[22] Filed: Jan. 27, 1989

[30] Foreign Application Priority Data

Jan. 29, 1988 [JP] Japan ................................ 63-17382
Mar. 31, 1988 [JP] Japan ................................ 63-78985

[51] Int. Cl.$^4$ ............................................. H04N 3/14
[52] U.S. Cl. ............................ 358/213.31; 358/213.19; 357/24
[58] Field of Search ..................... 358/213.31, 213.26, 358/213.19; 357/24 LR

[56] References Cited

U.S. PATENT DOCUMENTS

| | | | |
|---|---|---|---|
| 3,934,161 | 1/1976 | Caywood | 358/213.19 |
| 4,245,164 | 1/1981 | Funahashi | 357/24 LR |
| 4,443,886 | 4/1984 | Matsumoto et al. | 357/24 LR |
| 4,481,522 | 11/1984 | Jastrzebski et al. | 357/24 LR |
| 4,498,013 | 2/1985 | Kuroda et al. | 357/24 LR |
| 4,672,455 | 6/1987 | Miyatake | 358/213.19 |
| 4,717,945 | 1/1988 | Yusa et al. | 357/24 LR |

FOREIGN PATENT DOCUMENTS 62-16599 4/1987 Japan .

Primary Examiner—Jin F. Ng
Assistant Examiner—Stephen Brinich
Attorney, Agent, or Firm—Oblon, Spivak, McClelland, Maier & Neustadt

[57] ABSTRACT

A solid state image sensing device includes a plurality of light-receiving/storage elements formed on a semiconductor substrate, vertical registers vertically extending along the light-receiving/storage elements, a horizontal register connected to ends of the vertical registers and horizontally extending, a charge read section, arranged between the light-receiving/storage element and the vertical register, for reading charge from each light-receiving/storage element to the corresponding vertical register, and a charge injection section for injecting bias charge to each light-receiving/storage element. Excessive bias charge is discharged to the semiconductor substrate through the vertical registers by setting gates in the charge read sections to be low level.

11 Claims, 7 Drawing Sheets

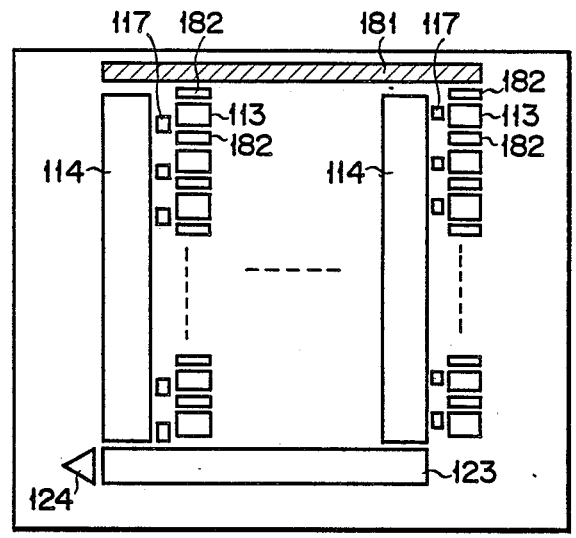
F I G. 12

SOLID STATE IMAGE SENSING DEVICE

BACKGROUND OF THE INVENTION

1. Field of the Invention

The present invention relates to a solid state image sensing device used in a television camera, an electronic still camera, and the like and, more particularly, to a solid state image sensing device having an improved discharging function.

2. Description of the Related Art

Solid state image sensing devices have been widely used in television cameras, electronic still cameras, and the like. In an inoperative state of such a solid state image sensing device, charge is stored in the respective components of the device. Upon operation of the device, it takes a long period of time to transfer and discharge the charge a plurality of times through vertical and horizontal registers. More specifically, in the inoperative state of the solid state image sensing device, a large amount of change is stored in photodiodes, the vertical and horizontal registers, and the like. Upon its operation, the charge stored in these components must be discharged first. For this reason, the charge stored in the vertical and horizontal registers is generally transferred through the vertical and horizontal registers in the normal transfer direction and is then discharged. Alternatively, the charge stored in the vertical register is transferred in an opposite direction and is then discharged to a drain at the end of the vertical register. The charge stored in the photodiodes is transferred to the vertical register and discharged therefrom.

Even if the above operation is performed at high speed, the charge must be discharged a plurality of times since a large amount of charge is stored in the above components in the inoperative state. It takes a long period of time from the start to the end of discharged. In particular, in an electronic still camera, the solid state image sensing device is started upon depression of a shutter. If it takes a long period of time to completely discharge the stored charge, a user must wait for a long period of time to take a picture while depressing the shutter. The user may miss a shutter chance. In addition, charge in a photoelectric transducer film is trapped in a trap level present in the film and is discharged after some period of time. Therefore, an after image characteristic in the solid state image sensing device is undesirably degraded. When a bias charge is applied to a light-receiving/storing section in order to reduce an after image, a scratch or fixed pattern noise is generated on an image by variations in charge amounts during discharge.

SUMMARY OF THE INVENTION

It is an object of the present invention to provide a solid state image sensing device capable of discharging charge within a short period of time.

It is another object of the present invention to provide a solid state image sensing device capable of preventing degradation of an after image characteristic which is caused by a trap level in a photoelectric transducer film and preventing generation of a scratch and fixed pattern noise on an image, thereby providing an excellent after image characteristic and preventing generation of unnecessary noise.

According to the present invention, there is provided a solid state image sensing device wherein the bias charge is injected into the charge storage section to improve the after image characteristic, and a discharge means can be improved to eliminate fixed pattern noise generated during discharge of excessive bias charge.

According to the present invention, there is provided a solid state image sensing device comprising a plurality of light-receiving/storage elements arranged on a semiconductor substrate in a matrix form, vertical registers vertically extending to be adjacent to the light-receiving/storage elements, a horizontal register horizontally extending to be connected to ends of the vertical registers, and a charge read section, located between each light-receiving/storage element and the corresponding vertical register, for reading signal charge from each light-receiving/storage element to the corresponding vertical register, wherein each light-receiving/storage element comprises a charge injection section for injecting a bias charge and a discharge section for discharging the injected bias charge.

According to the present invention, there is provided a solid state image sensing device wherein the discharge section comprises the same gate as that of the charge read section, and the bias charge is discharged from the light-receiving/storage element through the gate.

According to the present invention, there is provided a solid state image sensing device wherein the bias charge injecting means comprises a bias injection source formed adjacent to the light-receiving/storage element or the vertical register and a bias injection gate formed between the source and the light-receiving/storage element or the vertical register.

According to the present invention, since the bias charge is injected in the light-receiving/storage element, the after image characteristic can be improved. In addition, when an excessive bias charge is eliminated, since the same gate as that of the charge read section is used, the scratch and fixed pattern noise on the image can be eliminated.

Bias charge injection is not performed by using bias light but by injecting charge from the source to the light-receiving/storage element through the gate. A bias light source can be eliminated. Therefore, the system can be simplified and made compact as a whole.

BRIEF DESCRIPTION OF THE DRAWINGS

FIG. 12 is a plan view of a solid state image sensing device having a gate arranged between pixels according to still another embodiment of the present invention.

DETAILED DESCRIPTION OF THE PREFERRED EMBODIMENTS

Figure 1A:
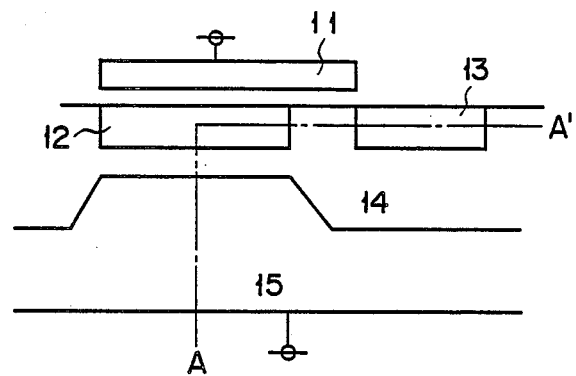
FIG. 1A is a sectional view of a solid state image sensing device according to an embodiment of the present invention.
Figure 1B:
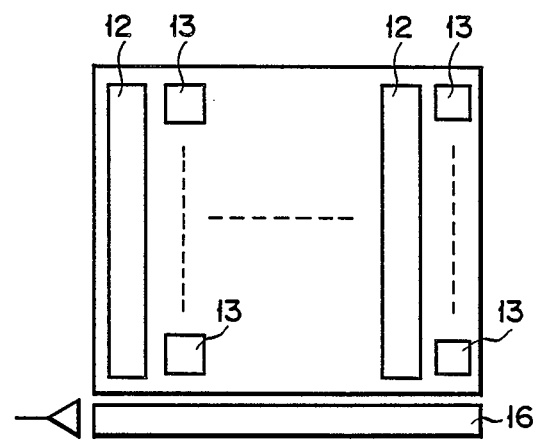
FIG. 1B is a plan view of the solid state image sensing device shown in FIG. 1A.
Figure 2:
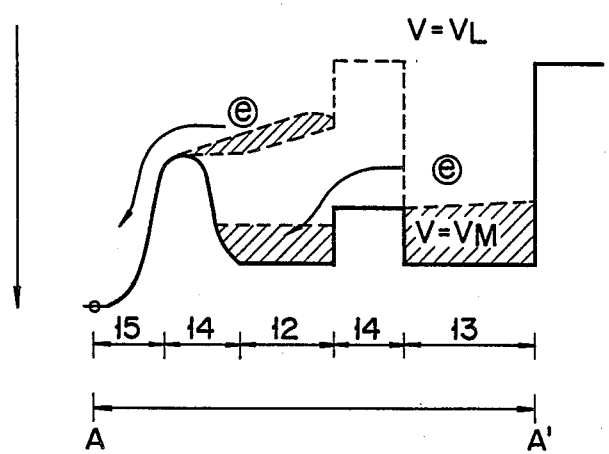
FIG. 2 is a view for explaining an operation of the solid state image sensing device shown in FIGS. 1A and 1B.

In an embodiment shown in FIGS. 1A and 1B, p-type well 14 is formed on n-type semiconductor substrate 15. P-type well 14 is formed to have a small thickness under each vertical register 12, thereby constituting a vertical overflow drain (VOD) structure. Charge stored in each vertical register 12 can be discharged from the VOD under each vertical register 12 by setting voltage V applied to each gate 11 to be low level VL. Charge stored in each of photodiodes 13 arranged in a matrix form can be transferred to corresponding vertical register 12 extending in the vertical direction by setting voltage V applied to each gate 11 to be high level VH. Thereafter, upon application of the low level voltage to gate 11, the charge stored in register 12 is discharged from the VOD under register 12.

The above discharge operation requires a smaller number of discharge operations that discharging in which all charges are discharged through horizontal register 16, thereby shortening the discharge time accordingly. A conventional solid state image sensing device requires a complex circuit for generating a pulse voltage to transfer charge from and to photodiodes 13 and vertical registers 12 at high speed. However, according to the present invention, discharge can be performed by a very simple pulse voltage, and therefore a load on circuit design can be reduced.

Figure 3:
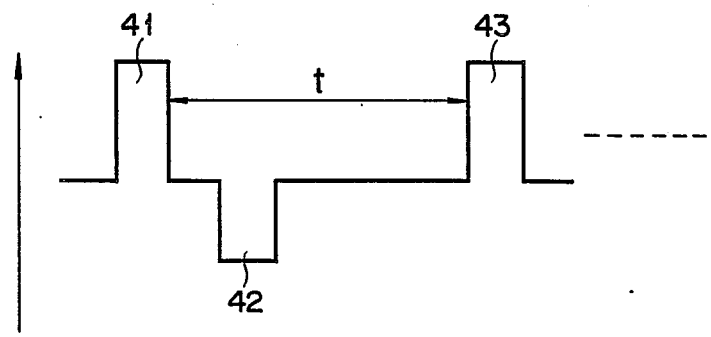
FIG. 3 is a waveform chart of pulses applied to a gate of the solid state image sensing device shown in FIGS. 1A and 1B.

The above effect can be obtained even if the VOD is located below both the vertical registers and the photodiodes. In addition, if a pulse voltage applied to gate 11 is appropriately regulated, the present invention can be used as an electronic shutter. More specifically, as shown in FIG. 3, pulse 41 is applied to gates 11 to transfer the charge from photodiodes 13 to corresponding vertical register 12. Pulse 42 is then applied to gates 11 to discharge the charge through the VOD under each vertical register 12. After pulse 41 is disabled and time interval t has elapsed, pulse 43 is applied to gates 11. Charge stored during time interval t is transferred to each vertical register 12 and is thus transferred in a normal operation, thereby obtaining a video signal. In this manner, time interval t is changed to change the storage time. Therefore, the present invention is applicable to an electronic shutter.

Another embodiment of the present invention will be described with reference to FIGS. 4 and 5.

According to this embodiment, thin p-type well 112 is formed on n-type semiconductor substrate 111. N-type layers 113 serving as a light-receiving/storage section are formed on the surface of well 112 in a matrix form. N-type layers (vertical registers) 114 serving as a charge transfer section vertically extend to be adjacent to arrays of n-type layers 113. Read gates 115 for reading out charges from n-type layers 113 to n-type layers 114 are formed on vertical registers 114, respectively. Transfer gates 116 are formed between gates 115 to transfer the charge in the vertical direction. Each transfer gate 116 extends above corresponding n-type layer 114 to an end of corresponding n-type layer 113. Charge read section 117 is defined as an area between corresponding n-type layers 113 and 114.

Pixel electrode 119 is formed on p-type well 112 and corresponding gates 115 and 116 through insulating film 118. Pixel electrode 119 is connected to corresponding light-receiving/storage layer 113 through corresponding lead electrode 120. Photoelectric transducer film 121 formed of amorphous Si or the like is formed on pixel electrode 119. Transparent electrode 122 formed of ITO or the like is formed on photoelectric transducer film 121.

Figure 5:
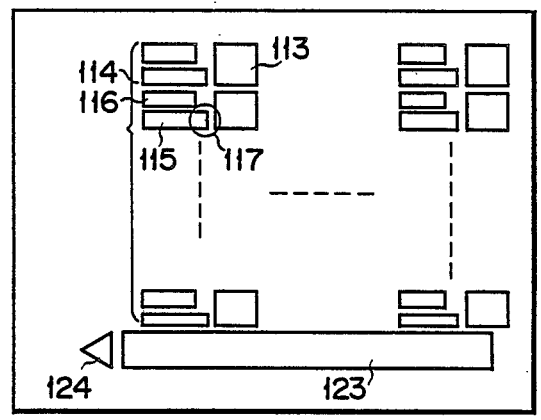
FIG. 5 is a plan view of the solid state image sensing device shown in FIG. 4.

As shown in FIG. 5, horizontal register 123 extends horizontally to be adjacent to the ends of vertical registers 114 so as to transfer the charge from registers 114. The charge from horizontal register 123 is detected by charge detection section 124 and output as a video signal.

In the solid state image sensing device having the above structure, light which passes through transparent electrode 122 is converted into charge by photoelectric transducer film 121. This charge is stored in light-receiving/storage layer 113 through corresponding electrode 119 and lead electrode 120. If this charge is signal charge, it is transferred to corresponding vertical register 114 through corresponding charge read section 117 and then to horizontal register 123. When bias light is incident on photoelectric transducer film 121, charge is filled in the trap level in photoelectric transducer film 121. At this time, excessive bias charge is stored in light-receiving/storage layer 113 through pixel electrode 119 and lead electrode 120. The charge stored in light-receiving/storage layer 113 is read out to corresponding vertical register 114 through corresponding charge read section 117. When an "L" level voltage is applied to each gate electrode 115 above corresponding vertical register 114, the excessive bias charge is discharged to semiconductor substrate 111 below vertical register 114.

According to the above method, the excessive bias charge stored in light-receiving/storage layer 113 and the charges injected from other portions can be effectively discharged in semiconductor substrate 111. Therefore, image scratches caused by variations in discharge amount can be prevented.

Figure 4:
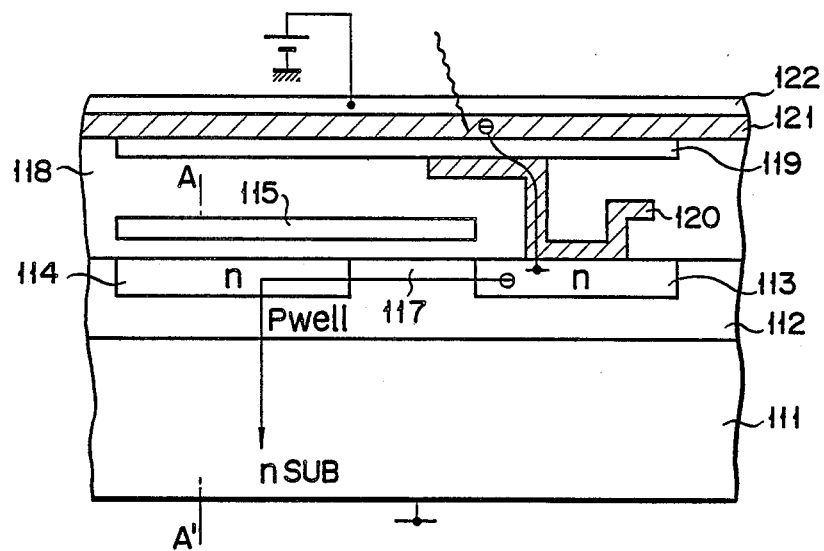
FIG. 4 is a sectional view of a solid state image sensing device according to another embodiment of the present invention.
Figure 6:
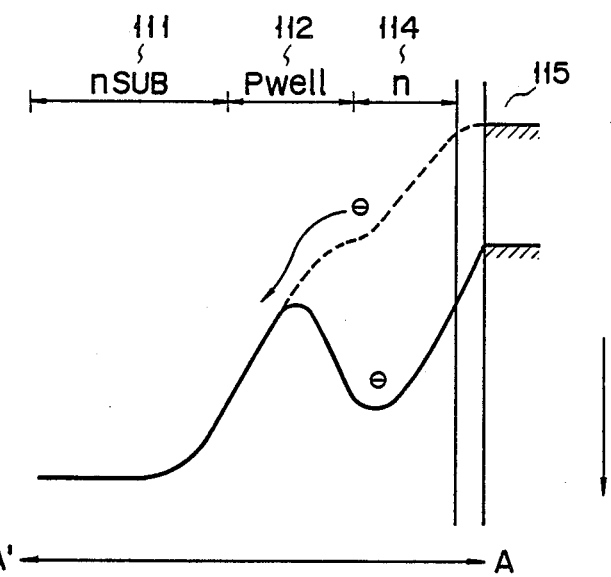
FIG. 6 is a view showing a potential distribution of the solid state image sensing device shown in FIG. 4.

A potential distribution in the A—A section of FIG. 4 is shown in FIG. 6. A solid line represents a distribution obtained when an "H" level voltage is applied to gate electrode 115, while a broken line represents a distribution obtained when an "L" level voltage is applied to gate electrode 115. As is apparent from FIG. 6, the excessive bias charge read to vertical register 114 is completely discharged to semiconductor substrate 111 under vertical register 114 by setting the voltage applied to each gate 115 to "L" level. In this case, the excessive bias charge is discharged to semiconductor substrate 111 through signal read gate 115 (charge read section 117). Even if variations in gate electrodes between the elements occur, the signal charge amount stored in light-receiving/storage layer 113 is a value proportional to an incident light amount regardless of the remaining bias charge amount. Therefore, generation of the scratch and fixed pattern noise of the image can be perfectly suppressed.

Figure 7:
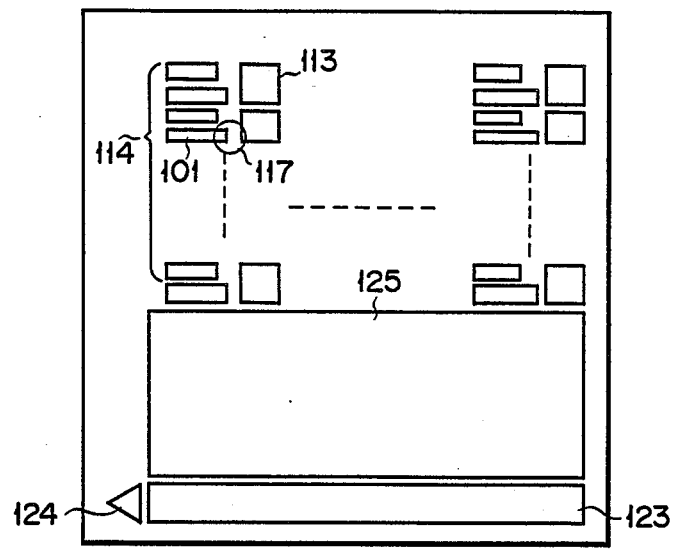
FIG. 7 is a plan view of a solid state image sensing device having a storage section according to still another embodiment of the present invention.

In a solid state image sensing device having charge storage section 125 shown in FIG. 7, the signal charge stored in light-receiving/storage layer 113 is read and transferred to vertical register 114 through charge read section 117 at high speed and is stored in storage section 125. This charge is transferred to charge detection section 124 through horizontal register 123 and output as a video signal. The bias charge stored in light-receiving/storage layer 113 is read to vertical register 114 through charge read section 117 and is then discharged from vertical register 114 to semiconductor substrate 111 by setting the voltage applied to gate 115 to "L" level. In this case, the bias charge is transferred to vertical register 114 and need not be discharged. The solid state image sensing device can be driven by a simple drive method.

Figure 8:
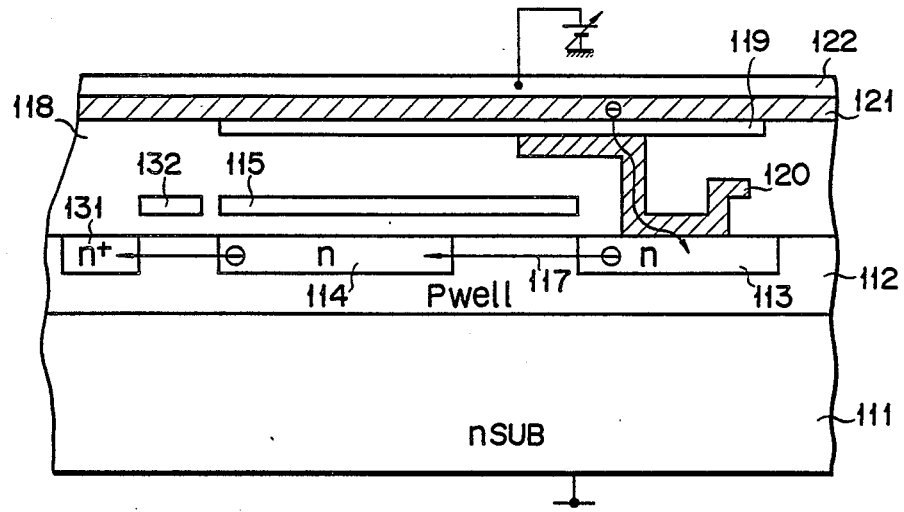
FIG. 8 is a sectional view of a solid state image sensing device having a drain and a discharge gate according to still another embodiment of the present invention.

Another method of discharging the excessive bias charge is shown in FIG. 8. Drain 131 and discharge gate 132 are formed adjacent to vertical register 114. Charge transferred to vertical register 114 is discharged to drain 131 through gate 132.

As a discharging method, a vertical overflow drain (VOD) structure may be formed below light-receiving/storage layer 113 to discharge charge. In this case, however, discharge amounts vary due to variations in potentials under respective light-receiving/storage layers 113, and fixed pattern noise is undesirably generated. In this embodiment, the signal charge and the excessive charge are read through single charge read section 117. Therefore, variations in respective light-receiving/storage layers 113 are canceled to each other, and fixed pattern noise can be eliminated.

In the above embodiment, when the bias charge is injected in light-receiving/storage layers 113, degradation of the after image characteristic caused by the trap level in the photoelectric transducer film can be prevented and an excellent after image characteristic can be obtained. In addition, the excessive bias charge can be discharged through the gate through which the signal charge is discharged, so that variations in light-receiving/storage layers can be canceled and generation of fixed pattern noise can be prevented. Therefore, the after image characteristic can be improved without degrading image quality, and the present invention can be applied to television cameras, electronic still cameras, and the like so as to obtain great effects.

Still another embodiment of the present invention will be described with reference to FIGS. 9 and 10.

According to this embodiment, a bias injection source and a bias injection gate which are formed in a substrate are used in place of bias light for injecting bias charge. More specifically, bias injection source 161 is formed in the vertical direction in p-type well 112 to be adjacent to light-receiving/storage layers 113. Bias injection gate 162 is formed between source 161 and light-receiving/storage layer 113.

In this device, gates 162 and 115 are disabled during signal charge storage. Light incident on a pixel portion is converted into charge. This signal charge is stored in light-receiving/storage layer 113. The stored signal charge is read to vertical register 114 by gate 115 and transferred from vertical register 114 to horizontal register 123. The signal charge is then transferred from horizontal register 123 to charge detection section 124. In this case, gate 115 is enabled to read the signal charge from light-receiving/storage layer 113 to vertical register 114. At the end of read operation, gate 115 is disabled, and then gate 162 is enabled. Therefore, bias charge is injected in light-receiving/storage layer 113 from source 161 to gate 162. The excessive bias charge is discharged from vertical register 114 to semiconductor substrate 111 by setting gate 115 to be low level in the same manner as in the previous embodiments.

Figure 9:
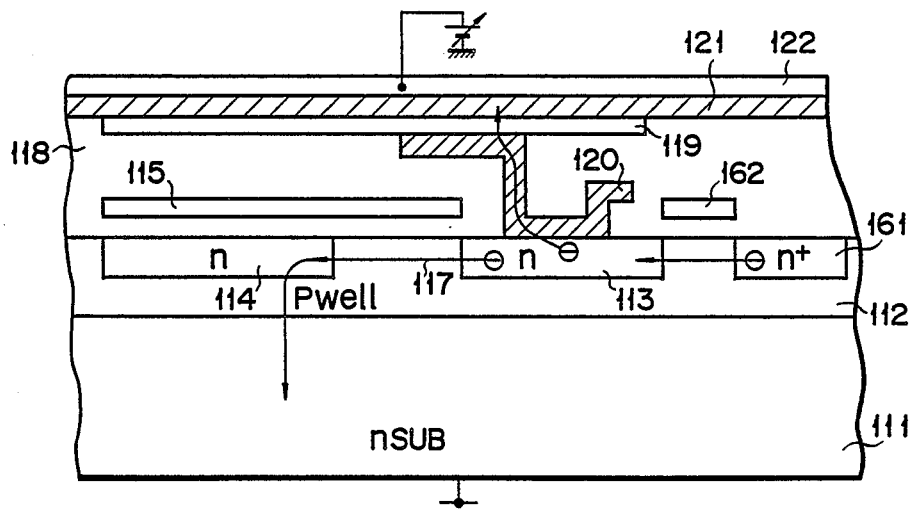
FIG. 9 is a sectional view of a solid state image sensing device having a bias injection source and a gate according to still another embodiment of the present invention.
Figure 10:
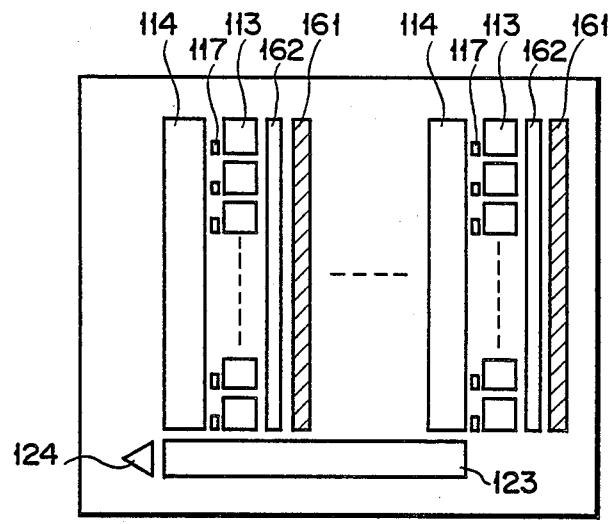
FIG. 10 is a plan view of the solid state image sensing device shown in FIG. 9.

According to the embodiment shown in FIGS. 9 and 10, the bias charge can be injected in light-receiving/storage layer 113 and the excessive charge can be discharged through the signal read gate in the same manner as in the previous embodiments. Therefore, the same effects as in the previous embodiments can be obtained. In addition, since the bias charge is directly injected from the source formed in the substrate in place of bias light, a bias light source can be omitted. The device can be simplified and made compact as a whole.

Figure 11:
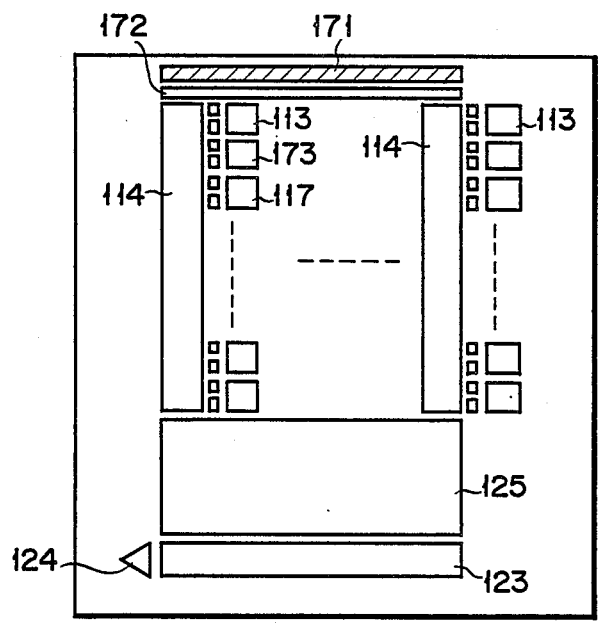
FIG. 11 is a plan view of a solid state image sensing device having first and second gates according to still another embodiment of the present invention.

Still another embodiment of the present invention will be described with reference to FIGS. 11 and 12. This embodiment is substantially the same as that of FIGS. 9 and 10. However, source 171 for charge injection is located near upper ends of vertical registers 114. First gate 172 is formed between source 171 and vertical registers 114. In addition to charge read gate 115 (located above charge read section 117), second gate 173 is formed between each vertical register 114 and a corresponding pixel.

According to this embodiment, during signal charge storage, gates 115, 172, and 173 are kept disabled. Light incident on the pixel portion is converted into charge. The signal charge is stored in light-receiving/storage layer 113. The stored signal charge is read to vertical register 114 by enabling gate 115 and is transferred to storage section 125 at high speed. The signal charge is then transferred to horizontal register 123 and to charge detection section 124 through horizontal register 123.

In charge transfer, when gates 115 are enabled, the signal charge is read to vertical register 114. At the end of read operation, gates 115 are disabled. At this time, the charge in vertical register 114 is transferred to storage section 125 at high speed. At the end of high-speed signal charge transfer, gate 172 is enabled to inject the charge in vertical registers 114. The charge injected in vertical arrays of pixels adjacent to respective vertical registers 114 is transferred to vertical registers 114 at high speed. When gates 173 are enabled, the charge stored in vertical registers 114 is injected in corresponding light-receiving/storage layers 113. Charge injection to each light-receiving/storage layer 113 must be completed before the signal charge stored in storage layer 113 is completely transferred to charge detection section 124 through horizontal register 123. When gates 115 are set at low level, the excessive bias charge is discharged to the semiconductor substrate in the same manner as in the previous embodiments.

Referring to FIG. 12, source 181 for charge injection is located near upper ends of vertical registers 114, and each gate 182 is located between pixels aligned in the vertical arrays. In this embodiment, during signal charge storage, gates 115 and 182 are kept disabled. Light incident on each pixel is converted into charge, and the signal charge is stored in light-receiving/storage layer 113. The stored signal charge is read to vertical register 114 by enabling gates 115 and is transferred from vertical register 114 to horizontal register 123. The signal charge is then transferred to charge detection section 124 through horizontal register 123.

In charge transfer, when gate 115 is enabled, the signal charge is read to vertical register 114. At the end of read operation, gate 115 is disabled, and then gate 182 is enabled. The bias charge is injected from source 181 to light-receiving/storage layer 113. The charge is sequentially injected through light-receiving/storage layers 113 in the vertical direction.

The present invention is not limited to the particular embodiments described above. Various changes and modifications may be made without departing the spirit and scope of the invention. For example, the light-receiving/storage layers need not be arranged in a matrix form. A linear array of light-receiving/storage layers may be employed.

According to the present invention as has been described above, since the bias charge is injected, the after image characteristic can be improved, and the scratch and fixed pattern noise of the image which are generated during discharge of the excessive bias charge can be eliminated. For this reason, degradation of the after image characteristic which is caused by the trap level in the photoelectric transducer film can be suppressed, and a solid state image sensing device which has an excellent after image characteristic and generates low noise can be obtained.

What is claimed is:

1. A solid state image sensing device comprising:
   a semiconductor substrate of a first conductivity type;
   a well region of a second conductivity type formed on said semiconductor substrate;
   a charge storage section, formed in said well region, for converting incident light into charge and storing the charge;
   a charge transfer section, formed in said well region to be adjacent to said charge storage section, for transferring the charge stored in said charge storage section;
   charge reading means, having gate means formed above said charge transfer section said extending up to an end of said charge storage section, for reading the charge from said charge storage section to said charge transfer section; and
   means for applying a predetermined voltage to said gate means to discharge the charge stored in said charge transfer section to said semiconductor substrate through said well region.

2. A device according to claim 1, wherein said well region comprises a region having an overflow drain structure formed to have a small thickness at a position corresponding to said charge transfer section.

3. A device according to claim 1, wherein said charge storage section comprises a plurality of photodiodes arranged in a matrix form, and said charge transfer section comprises a plurality of vertical registers vertically arranged along said photodiodes and a horizontal register arranged near ends of said vertical registers.

4. A solid state image sensing device comprising:
   a light-receiving/storage section formed on a semiconductor substrate;
   a charge transfer section arranged near said light-receiving/storage section;
   charge reading means, arranged between said light-receiving/storage section and said charge transfer section and having gate means extending above said charge transfer section up to an end of said charge storage section, said charge reading means adapted to read signal charge from said light-receiving/storage section to said charge transfer section;
   bias charge injecting means for injecting bias charge in said light-receiving/storage section; and
   charge discharging means for discharging the injected bias charge to said semiconductor substrate.

5. A device according to claim 4, wherein said light-receiving/storage section, in which the bias charge is injected by said charge injecting means, comprises a plurality of light-receiving/storage layers formed on said semiconductor substrate in a matrix form, said charge transfer section comprises a plurality of vertical registers having ends, respectively, and vertically arranged adjacent to said light-receiving/storage layers, and a horizontal register connected to said ends of said vertical registers and extending along a horizontal direction, and said charge reading means comprises means, arranged between said light-receiving/storage layers and said vertical registers, for reading the signal charge from each of said light-receiving/storage layers to a corresponding one of said vertical registers.

6. A device according to claim 5, wherein said charge discharging means comprises means for discharging the bias charge from said light-receiving/storage layers through said gate means in said charge reading means.

7. A device according to claim 5, wherein said bias charge injecting means comprises means for externally impinging bias light on said light-receiving/storage section.

8. A device according to claim 5, wherein said bias charge injecting means comprises a bias injection source arranged near one of said light-receiving/storage layer and said vertical register, and a bias injection gate arranged between said source and the one of said light-receiving/storage layer and said vertical register.

9. A device according to claim 5, wherein said charge discharge means includes means for setting said gate means to be low level.

10. A device according to claim 5, further including a storage section formed between said vertical register and said horizontal register.

11. A device according to claim 5, further including a source formed at said ends of said vertical registers, a first gate formed between said source and said vertical registers, and a second gate formed between each of said vertical registers and a corresponding one of said light-receiving/storage layers.

* * * * *

UNITED STATES PATENT AND TRADEMARK OFFICE
CERTIFICATE OF CORRECTION

PATENT NO. : 4,912,560
DATED : MARCH 27, 1990
INVENTOR(S) : SHINJI OOSAWA ET AL.

It is certified that error appears in the above-identified patent and that said Letters Patent is hereby corrected as shown below:

On the title page, under items [19] and [75]:

In the inventors, delete "Osawa" and insert --Oosawa--.

Signed and Sealed this

Twenty-seventh Day of August, 1991

Attest:

HARRY F. MANBECK, JR.

Attesting Officer

Commissioner of Patents and Trademarks